(12) United States Patent
Säleniemi et al.

(10) Patent No.: US 8,548,609 B2
(45) Date of Patent: Oct. 1, 2013

(54) METHOD AND SOFTWARE PRODUCT FOR DESIGNING DRILLING PATTERN FOR ROCK CAVITY EXCAVATION

(75) Inventors: Tommi Säleniemi, Tampere (FI); Erkki Eilo, Tampere (FI); Martti Keskinen, Espoo (FI); Jussi Koskelainen, Helsinki (FI); Jouko Muona, Siuro (FI); Pasi Latva-Pukkila, Ylöjärvi (FI)

(73) Assignee: Sandvik Mining and Construction Oy, Tampere (FI)

( * ) Notice: Subject to any disclaimer, the term of this patent is extended or adjusted under 35 U.S.C. 154(b) by 585 days.

(21) Appl. No.: 12/679,202

(22) PCT Filed: Sep. 19, 2008

(86) PCT No.: PCT/FI2008/050517
§ 371 (c)(1),
(2), (4) Date: Jul. 6, 2010

(87) PCT Pub. No.: WO2009/037381
PCT Pub. Date: Mar. 26, 2009

(65) Prior Publication Data
US 2010/0286965 A1 Nov. 11, 2010

(30) Foreign Application Priority Data
Sep. 21, 2007 (FI) ...................... 20075661

(51) Int. Cl.
*G05B 15/00* (2006.01)
*G06F 17/50* (2006.01)
*E21D 9/00* (2006.01)

(52) U.S. Cl.
USPC .................. 700/83; 700/182; 703/1; 102/312

(58) Field of Classification Search
USPC .................. 700/83, 180, 182, 194; 703/1, 2, 703/6; 702/9; 102/311, 312; 405/138; 175/24, 175/26, 40
See application file for complete search history.

(56) References Cited

U.S. PATENT DOCUMENTS 3,917,348 A 11/1975 Janssen
4,603,910 A 8/1986 Lanéus
(Continued)

FOREIGN PATENT DOCUMENTS

FI 105942 10/2000
FI 20065854 6/2008
(Continued)

OTHER PUBLICATIONS

Finland Office Action dated Sep. 1, 2008 issued in Finland Application No. 20075661.
(Continued)

*Primary Examiner* — Sean P. Shechtman
*Assistant Examiner* — Steven Garland
(74) *Attorney, Agent, or Firm* — Morgan, Lewis & Bockius LLP

(57) ABSTRACT

A method for designing a drilling pattern for rock cavity excavation and a software product implementing the method. The drilling pattern is created by means of a design program. The drilling pattern defines several starting points of drill holes in a navigation plane, end points of the drill holes on the bottom of a round and further the directions and lengths of the drill holes. The face of the round is designed to have a desired shape by determining the locations of the end points for the desired face profile. A three-dimensional face profile is entered into the design program, which subsequently places end points to the face profile automatically.

11 Claims, 7 Drawing Sheets

(56) References Cited

U.S. PATENT DOCUMENTS

| | | | |
|---|---|---|---|
| 4,639,868 A * | 1/1987 | Tanaka et al. | 702/9 |
| 6,293,355 B1 | 9/2001 | Koivunen et al. | |
| 8,214,073 B2 * | 7/2012 | Keskinen | 175/24 |
| 2010/0078215 A1 * | 4/2010 | Saleniemi et al. | 175/24 |
| 2010/0086359 A1 * | 4/2010 | Saleniemi | 405/138 |

FOREIGN PATENT DOCUMENTS

| | | |
|---|---|---|
| WO | 98/57034 | 12/1998 |
| WO | 03/025341 | 3/2003 |
| WO | 2008/078001 | 7/2008 |

OTHER PUBLICATIONS

Finland Search Report dated Aug. 28, 2008 issued in Finland Application No. 20075661.

International Search Report mailed Jan. 2, 2009 issued in PCT Application No. PCT/FI2008/050517.

International Preliminary Report on Patentability completed Dec. 11, 2009 issued in PCT Application No. PCT/FI2008/050517.

* cited by examiner

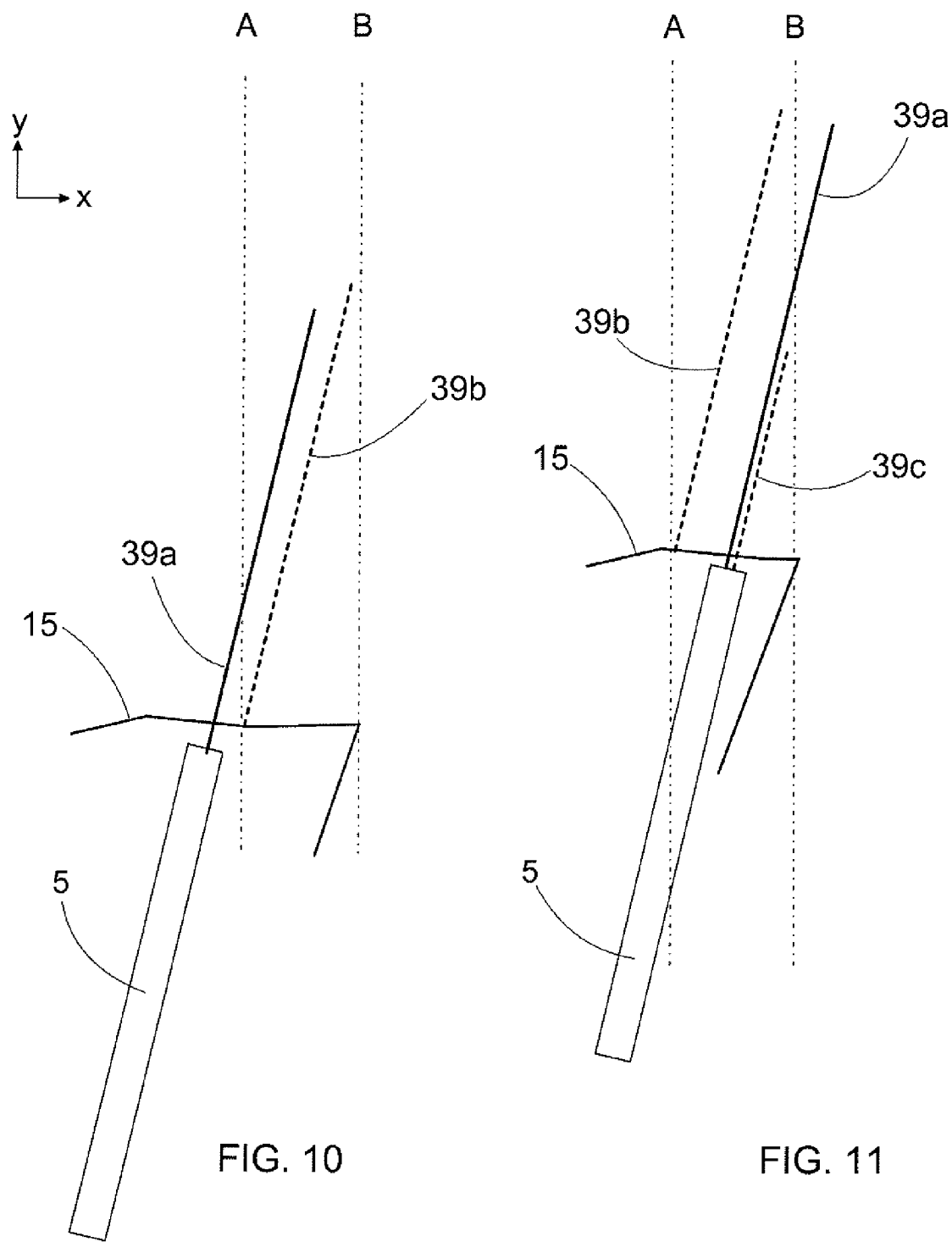

METHOD AND SOFTWARE PRODUCT FOR DESIGNING DRILLING PATTERN FOR ROCK CAVITY EXCAVATION

CROSS REFERENCE TO RELATED APPLICATIONS

This application is the National Stage of International Application No. PCT/FI2008/050517, filed Sept. 19, 2008, and claims benefit of Finnish Application No. 20075661, filed Sept. 21, 2007.

BACKGROUND OF THE INVENTION

The invention relates to a method for designing a drilling pattern for rock cavity excavation. For a round to be drilled in a face of the rock cavity the drilling pattern determines at least the locations and directional angles of drill holes in the coordinate system of the drilling pattern. In the method the designer draws up the drilling pattern with the assistance of design software. The object of the invention is described in greater detail in the preamble of the first independent claim.

The invention also relates to a software product in accordance with the second independent claim, the execution of which product on a design computer or the like produces operations required for the drilling pattern design.

Tunnels, underground storage hall and other rock facilities are excavated in rounds. In the face of a rock cavity there are drilled holes that are charged and blasted after drilling. One blasting detaches rock material from the rock for one round. For excavation of a rock cavity, a plan is made in advance, a theoretical excavation profile is drawn up and data on rock type, for instance, is determined. In general, the ordering party also sets various quality requirements for the space to be excavated. For each round, there is also designed, at the design board, a drilling pattern that is supplied to a rock drilling rig for drilling holes in the rock such that a desired round will be formed. When the drilling pattern is formed, it may be implemented in the rock drilling rig. When rock facilities of complex shape are excavated, it is not possible to use the same drilling pattern for drilling successive rounds, but each round may need a specific drilling pattern, or alternatively, the drilling pattern may need modification for each round.

Publication FI 105 942 B discloses a solution, in which the length of an existing drilling pattern may be continuously altered to correspond to the length of a round to be drilled at any particular time. The position of the starting face in drilling is shifted in the drilling direction or in the opposite direction. The locations of the drill hole end points are maintained, but instead, new starting points for the drill holes are determined on a new starting face or the directional angle of the drill holes is changed. In the solution of the publication the shape of the drilling round is maintained the same and just the length of the drilling pattern is adjusted.

Rock cavities may, however, include curved surfaces or the face of the round to be drilled may be inclined horizontally or vertically. Further, rock cavities may be sharply curved when observed in the working direction, whereby sheer directioning of the drilling pattern will not provide a desired sharp curve. In that case a sheer changing in the length of the drilling pattern as disclosed in said publication will not suffice. So, currently, complex face shapes of rounds have to be designed manually by drawing up a plurality of 2-dimentional projections so as to determine lengths, locations and directions of drill holes for the drilling pattern. This is slow and difficult, however. Moreover, as the design takes place using several different projections, it will be difficult for the designer to perceive the whole and to detect errors in the drilling pattern, if any.

BRIEF DESCRIPTION OF THE INVENTION

The object of the invention is to provide a novel and improved method for designing a drilling pattern for drilling a face in a round of complex shape. A further object, is to provide a novel and improved software product for the drilling pattern design.

The method of the invention is characterized by providing the design program with a face profile representing the shape of the face in a round to be drilled; and placing the end points of drill holes to be drilled in the drilling pattern to locations in accordance with the face profile in the coordinate system of the drilling pattern by means of a design computer, whereby drill holes of different lengths in the drilling pattern define the shape of the predetermined face profile.

The software product of the invention is characterized in that execution of the design program is arranged to place the locations of the end points of drill holes to be drilled in the drilling pattern in response to feeding a face profile representing the shape of the face in the round to be drilled, whereby the drill holes of different lengths in the drilling pattern define the shape of the predetermined face profile.

The basic idea of the invention is that the drilling pattern design employs a design program which is provided with data on the shape of a face in a round, i.e. a face profile. Thus, on the basis of data provided, the design program places the end points of drill holes included in the pattern to locations according to the face profile in the bottom of the round such that a desired face shape will be achieved. In that case the drill holes of different lengths in the drilling pattern define the shape of the predetermined face profile for the bottom of the face.

The invention has an advantage that it will be fast and easy to design a drilling pattern for a round comprising even complex face surfaces and shapes as the design program places the locations of the drill hole bottoms correctly such that the desired face shape will be achieved. In addition, the design computer makes the necessary calculations required for determining the coordinates of the end points of the drill holes, for instance, and for computing the lengths of the drill holes. Further, the arrangement of the invention reduces the number of errors, because there will be no longer need for a variety of manual computing steps and manual design to be performed in various projections.

The basic idea of one embodiment is that a design program is provided with a predetermined, three-dimensional profile model of a rock cavity to be drilled. The profile model may be drawn up, for instance with the assistance of a CAD program or the like, by the party ordering the rock facility. The embodiment also defines for the design program the location of a round in said profile model, whereby the design program will be able to define a face profile of the bottom of the round to be drilled by means of the location of the round and the three-dimensional profile model. The face profile may comprise at least one curved portion that defines a curved contour of the rock cavity to be formed and at least one substantially planar portion on the bottom of the round. Finally, end points of drill holes will be placed on said face profile. In practice, the shape of the face may be somewhat cup-shaped, but for the sake of clarity it will be referred to as "substantially planar portion" in this application document.

The basic idea of one embodiment comprises designing a drilling pattern for a rock cavity including a sharp curve. In that case the face profile of a round comprises, seen in the direction of the round, a portion of a side profile and a substantially planar portion on the bottom of the round.

The basic idea of one embodiment comprises designing a drilling pattern for a rock cavity including a curved roof profile. In that case the face profile of a round comprises, seen in the direction of the round, a portion of a roof profile and a substantially planar portion on the bottom of the round.

The basic idea of one embodiment comprises providing the design program with a predetermined, three-dimensional profile model of the rock cavity to be drilled and defining the location of a round in the profile model by means of peg numbers. The peg numbers are defined as distances from a predetermined reference point, for instance, starting from the initial point of the rock cavity.

The basic idea of one embodiment comprises placing the end points of the drill holes first in plane on the bottom of a round. Thereafter, the drill holes that extend outside the predetermined round are cut and the end points of these holes are placed at the intersection of the drill holes and the face profile.

The basic idea of one embodiment comprises placing the end points of the drill holes first in plane on the bottom of a round. Thereafter, the drilling pattern is modified by transferring the end points of the drill holes to the predetermined face profile while maintaining the coordinates of the start point and the end point of the drill holes in the direction of the navigation plane, i.e. the x and z coordinates of the end points are kept unchanged. Instead, the y coordinates of the end points change. Likewise, the directional angles of the drill holes change.

The basic idea of one embodiment comprises placing the end points of the drill holes first in plane on the bottom of a round. Thereafter, the drilling pattern is modified by transferring the end points of the drill holes to the predetermined face profile while maintaining the original directions of the drill holes and maintaining the coordinates of the end points in the direction of the navigation plane. In other words, the x and z coordinates of the end points are kept unchanged, but the y coordinates thereof change. Likewise, the start points of the drill holes on the navigation plane change.

The basic idea of one embodiment is that the designer defines manually on the display device of the design computer or the control unit of a rock drilling rig the shape of the round bottom. When the shape of the round bottom has been designed, the data thereof, i.e. the face profile, is applied to the design computer for the drilling pattern design. The display device may present the round in desired projections, such as xz projection in the direction of drilling, and as a top view, i.e. xy-projection. The design program may also comprise a slicing tool, by means of which the designer may slice the round in slicing planes. Thereafter, the designer may define separately for each slicing plane a face profile using straight lines and arches of a circle. With these straight lines, arches of a circle or the like shape lines defined by the user, the desired shape is cut for the round in different slicing planes, and when the slicing plane data are combined on the design computer, a three-dimensional face profile will be obtained. This application may be utilized, for instance, when there only exists a technical drawing on paper, and no three-dimensional electronic model, on the rock cavity to be excavated.

The basic idea of one embodiment is that the already existing drilling pattern may be modified by providing the design program with a new face profile, or by providing a new theoretical excavation profile of the rock cavity and a location of a round therein. In that case the design program may determine new locations for the end points of drill holes and update other drilling pattern data.

The basic idea of one embodiment comprises designing a drilling pattern on a design computer remote from a rock cavity and transmitting the drilling pattern to a control unit of a rock drilling rig for drilling.

The basic idea of one embodiment comprises designing a drilling pattern or modifying it in the control unit of the rock drilling rig.

The basic idea of one embodiment comprises designing a drilling pattern for a so-called inclined face first in navigation plane, and thereafter the pattern is modified such that the end points of the drill holes will be located on a desired face profile that is at an angle to the navigation plane. The designer may enter the shape of the face profile to the design computer, for instance, as angular data between the navigation plane and the inclined face or as distances. Alternatively, it is possible to measure the shape of the previous inclined face with a laser, for instance, to transmit the measurement data to the design computer and to modify the drilling pattern in the navigation plane such that the inclination of the face will remain substantially the same in a new round as in the previous round. The inclined face may be used at least after first excavating a so-called pilot tunnel that will be expanded with a round to be excavated beside the pilot tunnel. In that case the face of the round to be excavated beside the pilot tunnel may be inclined such that it is deepest on the border of the pilot tunnel side. Because of this the rock will break more easily towards the pilot tunnel. In addition, strength-related matters may support the use of an inclined face in excavation.

The basic idea of one embodiment is that the design computer modifies the drilling pattern designed in navigation plane by modelling the inclination of the round face. The modelling may be implemented by means of an auxiliary plane, which the design computer sets in place and the direction of which models the directional difference between the navigation plane and the face of the rock cavity.

The basic idea of one embodiment is that when the drilling pattern is modified for an inclined face, the drill holes designed in navigation plane are transferred towards a desired face profile while maintaining the directional angles of the drill holes and the x and z coordinates of the end point. Whereas the y coordinates of the end points will change, when they are placed on the face profile. The y coordinates of the initial points of the drill holes will also change correspondingly. After the transfer, drill holes including in the drilling pattern will be extended, however, from their starting points up to the navigation plane in the direction of the drill holes. In that case the starting point of each drill hole is shifted back to the navigation plane, but in a new location and it receives new coordinates.

The basic idea of one embodiment is that for the drilling pattern design a software product is loaded onto the design computer from a storage or memory medium, such as a memory stick, a memory diskette, a hard disk, a network server or the like, the execution of which software product in the processor of the design computer or the like produces operations described in this application document for designing and modifying a drilling pattern.

BRIEF DESCRIPTION OF THE DRAWINGS

Some embodiments of the invention will be described in greater detail in connection with the attached drawings, in which

FIGS. 10 and 11 show schematically an application, where the display device shows the positioning of drill holes within the allowed profile limits A and B;

For the sake of clarity, some embodiments of the invention are shown in the simplified manner in the drawings. Like reference numerals refer to like parts in the figures.

DETAILED DESCRIPTION OF SOME EMBODIMENTS OF THE INVENTION

Figure 1:
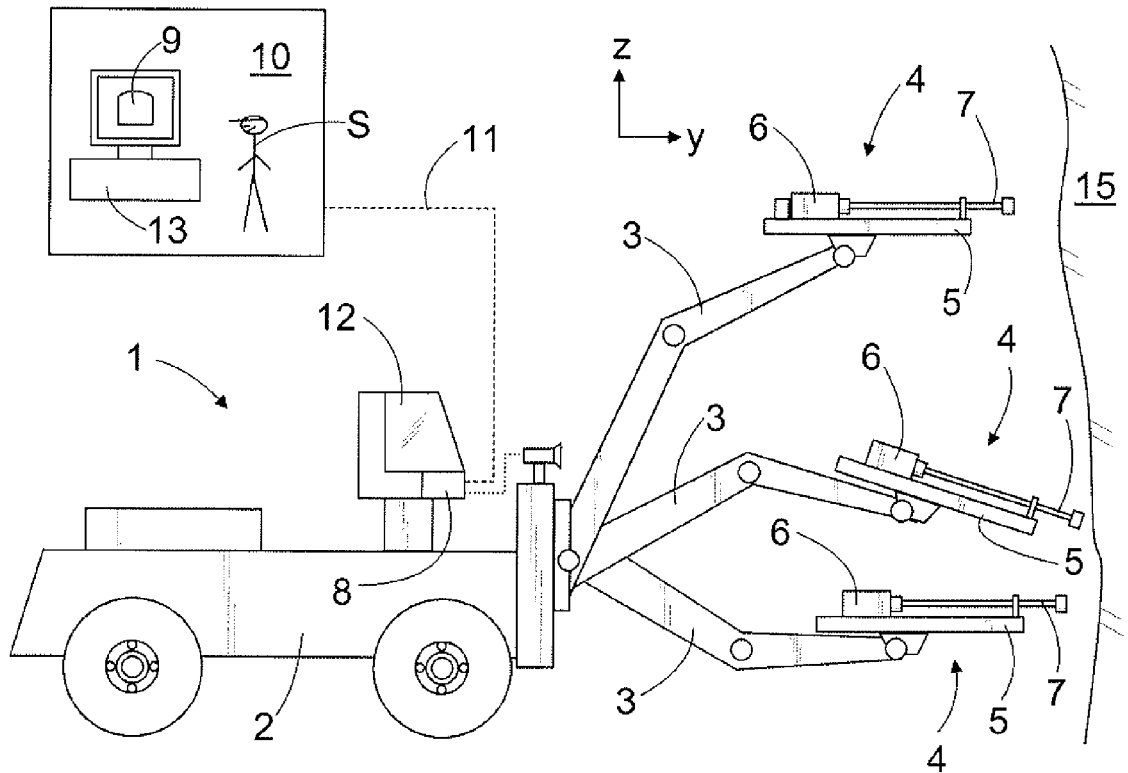
FIG. 1 is a schematic side view of a rock drilling rig and means for designing and editing a drilling pattern.

FIG. 1 shows a rock drilling rig 1, which comprises a movable carrier 2, one or more drill booms 3 and drilling units 4 arranged in the drill booms 3. The drilling unit 4 comprises a feed device 5 whereby a rock drill 6 may be moved. The feed device 5 may comprise a feed beam and a feed mechanism for moving the rock drill 6. The drilling unit 4 further comprises a tool 7, wherewith the impact pulses delivered by a percussion device of the rock drill are transmitted to the rock to be drilled. The rock drilling rig 1 also comprises at least one control unit 8 that is arranged to control the actuators included in the rock drilling rig 1. The control unit 8 may be a computer or the like and it may comprise a user interface with display devices and control means for delivering commands and data to the control unit 8.

Figure 2:
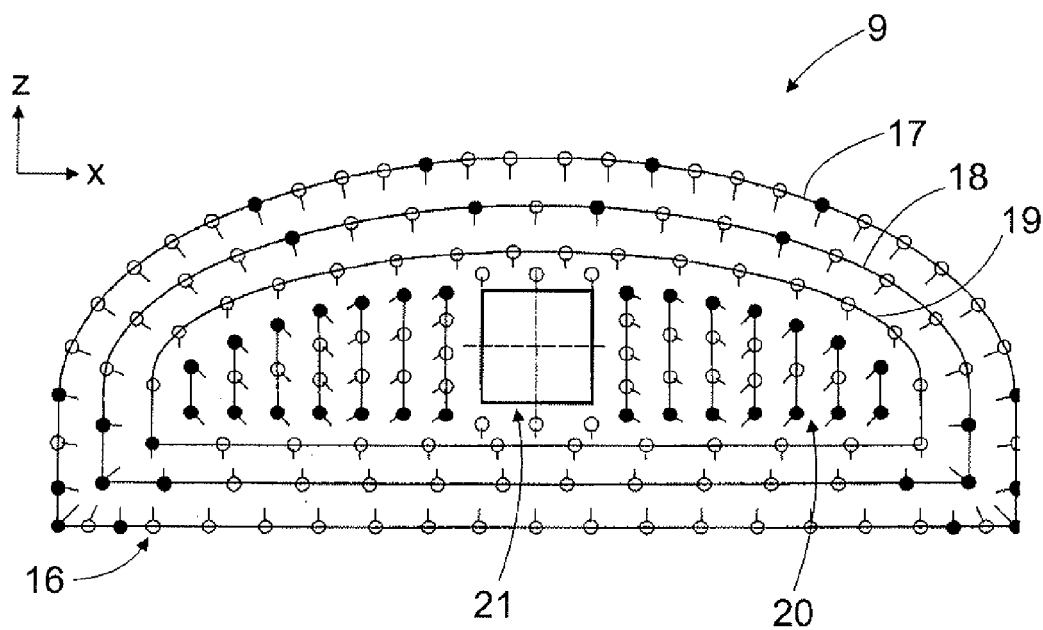
FIG. 2 is a schematic view of a drilling pattern seen in xz projection.

Typically, for drilling of each round there is designed a drilling pattern 9 as the one shown in FIG. 2, which defines at least the locations and directional angles of holes to be drilled in the coordinate system of the drilling pattern. Further, the drilling pattern 9 may determine the lengths of the holes to be drilled, or the lengths may be determined by means of the initial locations and the end points of the drill holes. The location of a drill hole may be defined by means of the coordinates of its starting point and end point, or alternatively, on the basis of the starting location, the directional angle and the length. The drilling pattern may be designed in an off-site location, such as an office 10, where it may be stored on a memory medium, such as a memory stick or disk, or it may be transmitted directly over a data transmission connection 11 to the control unit 8 of the rock drilling rig and stored there in a memory means, such as a hard disk or diskette. Alternatively, designing and editing of the drilling pattern 9 may be implemented by means of the control unit 8, for instance, in a cabin 12 of the rock drilling rig 1. Further, the existing drilling patterns may be edited on or off the drilling site. Designing and editing of the drilling pattern 9 are computer-assisted procedures and generally of iterative type. The design program is run on a design computer 13, the control unit 8 or the like, and the designer S operates in interaction with the design program and enters necessary data, makes choices and controls the design process. In the course of the design, existing parts of the pattern may be edited iteratively to achieve a better final result.

Once the drilling pattern is designed, it may be loaded in the control unit 8 of the rock drilling rig and then realized. The designed drill holes are drilled in the rock 15, charged and blasted. From the rock 15 there is detached rock material for an amount of a desired round and it is transported from the site. Thereafter, new drill holes are drilled for a subsequent round following a new drilling pattern 9.

FIG. 2 shows a drilling pattern 9, which may comprise a plurality of drill holes 16 arranged in a plurality of nested rows 17 to 19. The outermost hole row is a end profile 17 that defines an outer contour of the round to be excavated. In addition to the drill hole rows 17 to 19, the drilling pattern 9 may comprise field holes 20 arranged in the portion between the innermost drill hole row 19 and a cut 21. The cut 21 is arranged to form an initial space in blasting, where other portions of the round may open when the round is blasted. Drilling pattern design takes into account technical details relating to explosives, when determining spacing between drill holes, for instance, and distances between the drill hole rows.

Figure 3:
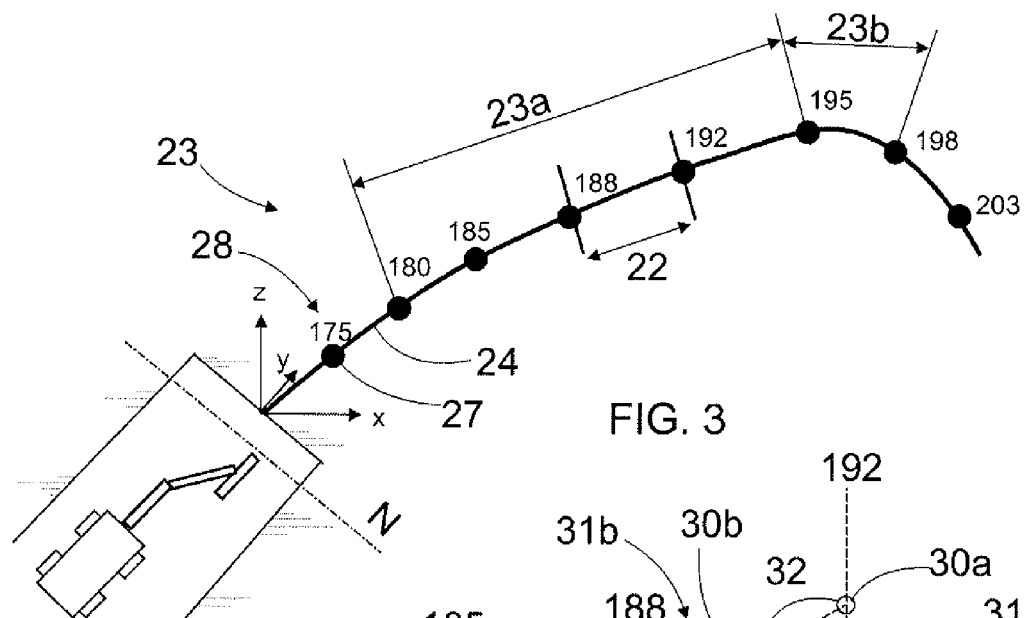
FIG. 3 is a schematic top view of a rock cavity to be drilled and peg numbers to be used therein.

FIG. 3 illustrates an arrangement, seen from above, for determining a location for a round 22 in relation to a rock cavity 23. The rock cavity 23 may comprise a predetermined centre line 24 and theoretical outer contours 25 and 26 shown later in FIGS. 4 and 5. The rock cavity 23 may further comprise points 27 arranged on the centre line 24 with mutual spacing. The client ordering the rock cavity 23 may define in advance the outer contour of the rock cavity, i.e. a theoretical excavation profile, location of the centre line 24 and further the coordinates of the points 27. Each point 27 has a specific peg number 28, which indicates the depth of the rock cavity 23 at a given location from a reference point. The peg number 28 may be given, for instance, in meters from the initial point of the rock cavity. The peg number 28 may be utilized in navigating the rock drilling rig to the drilling site. On the basis of the peg number 28 it is possible to determine the location of a navigation plane N in the xz direction, whereafter the drilling pattern 9 is placed on the navigation plane N. In addition, peg numbers 28 may be utilized in the drilling pattern design. Namely, by means of the peg numbers 28 it is possible to provide the design program with data on the location of the round 22 to be designed in the rock cavity 23, whereby a face profile of said round is also defined.

Figure 4:
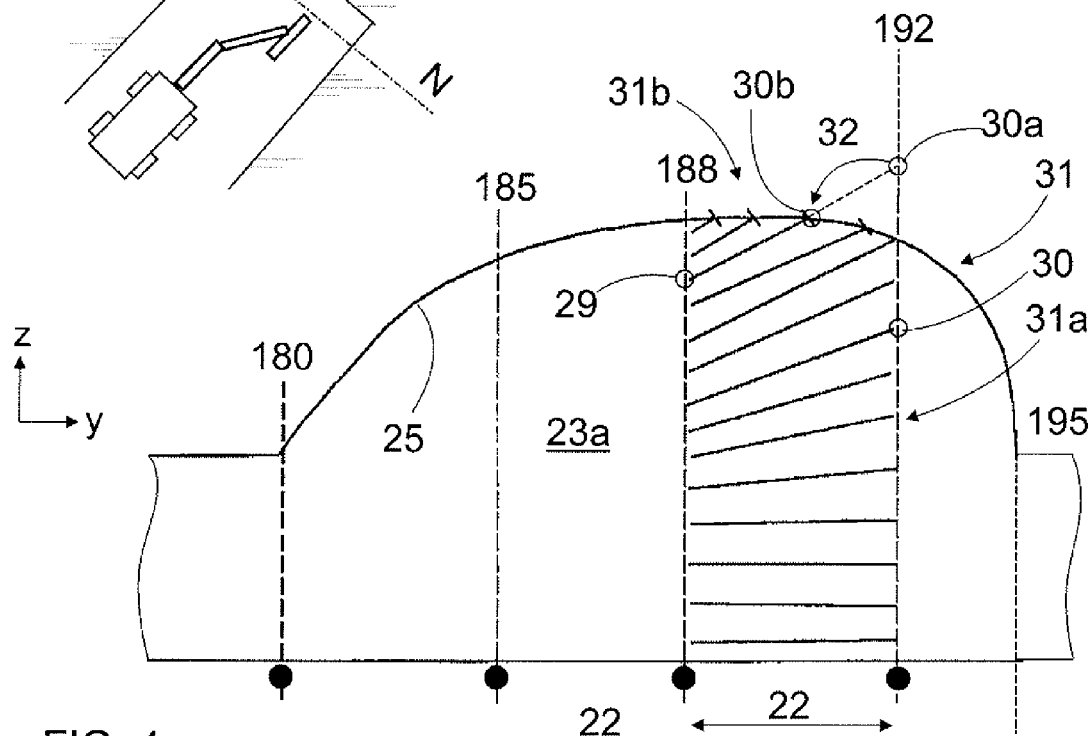
FIG. 4 is a schematic side view of a rock cavity comprising curved roof surfaces.

FIG. 4 illustrates a profile in the portion 23a between the peg numbers 180 and 195 in the rock cavity 23 of FIG. 3, which shows that the rock cavity has a curved outer contour, in this case a roof contour 25. In addition, the rock cavity may comprise side profiles including curved portions or they may be shaped in some other manner. The rock cavity may thus have a three-dimensional shape, i.e. it may be a so-called spatial space. The locations of peg numbers 180, 185, 188, 192 and 195 are depicted by broken lines. The navigation plane N of the drilling pattern 9 may be arranged in the round 22 at a point defined by peg number 188. The starting points 29 of the drill holes may then be located in the navigation plane N. Some of the end points 30 of the drill holes may be located in plane at peg number 192 and some of the end points 30 will be placed on a curved roof contour 25. Consequently, the face profile 35 of the round comprises a planar portion 31*a* and a curved portion 31*b*. When the peg numbers 28 and the outer contour 25 of the rock cavity 23 have been entered in the design program, the design program will be able to define automatically the face profile 31 of the round 22 and to place the end points 30 onto the face profile.

Typically, the starting points 29 and the end points 30 of the drill holes are located in plane. It is possible that the design program will also now place all end points 30 first in the planar portion on the bottom of the round 22, in this case at peg number 192, and only thereafter cuts the portions of drill holes extending outside the curved roof contour 25 at the intersection of the roof contour 25 and the drill hole. Thereafter it is possible to transfer the end point 30 of the drill hole extending outside the face profile 31 towards the starting point 29 in the direction of the drill hole, whereby the length of the drill hole reduces as compared with the original length. The transfer is illustrated by arrow 32 in FIG. 4.

Figure 5:
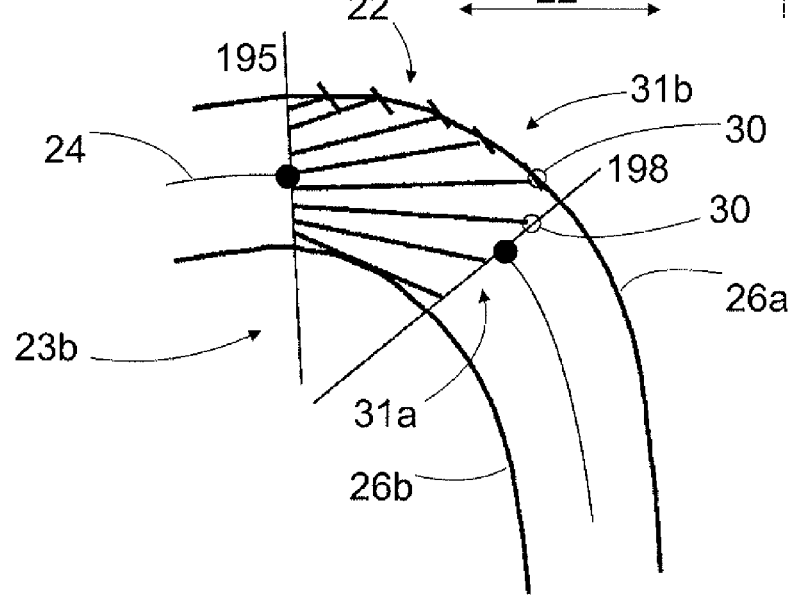
FIG. 5 is a schematic top view of a rock cavity delimited by side profiles and having a sharp curve.

FIG. 5 illustrates a sharp curve in the portion 23*b* between peg numbers 195 and 198 in the rock cavity 23 of FIG. 3. The rock cavity 23 may be delimited by side profiles 26*a* and 26*b* on both sides of the centre line 24. The side profiles 26, the roof contour 25 and corresponding theoretical outer contours may define the three-dimensional shapes of the rock cavity and they may be designed in advance by the ordering party or the rock cavity designer, for instance, with the assistance of a CAD program. The outer contours of the rock cavity may be fed into the design program for the drilling pattern design. In the situation of FIG. 5 the starting points 29 of the drill holes may be located in the navigation plane N at peg number 195 and some of the end points 30 of the drill holes may be located in plane at peg number 198. Further, some of the end points 30 are placed on the side profile 26*a* on the outer edge of the curve. The face profile 31 of the round may thus comprise a planar portion 31*a* and a curved portion 31*b*. Also in this case the design program may first place all end points 30 in the planar portion and thereafter cut the drill holes at the intersection of the side profile 26*a* and the drill holes. Alternatively, the design program may place the end points 30 directly in the curved portion 31*b* of the face profile.

Figure 6:
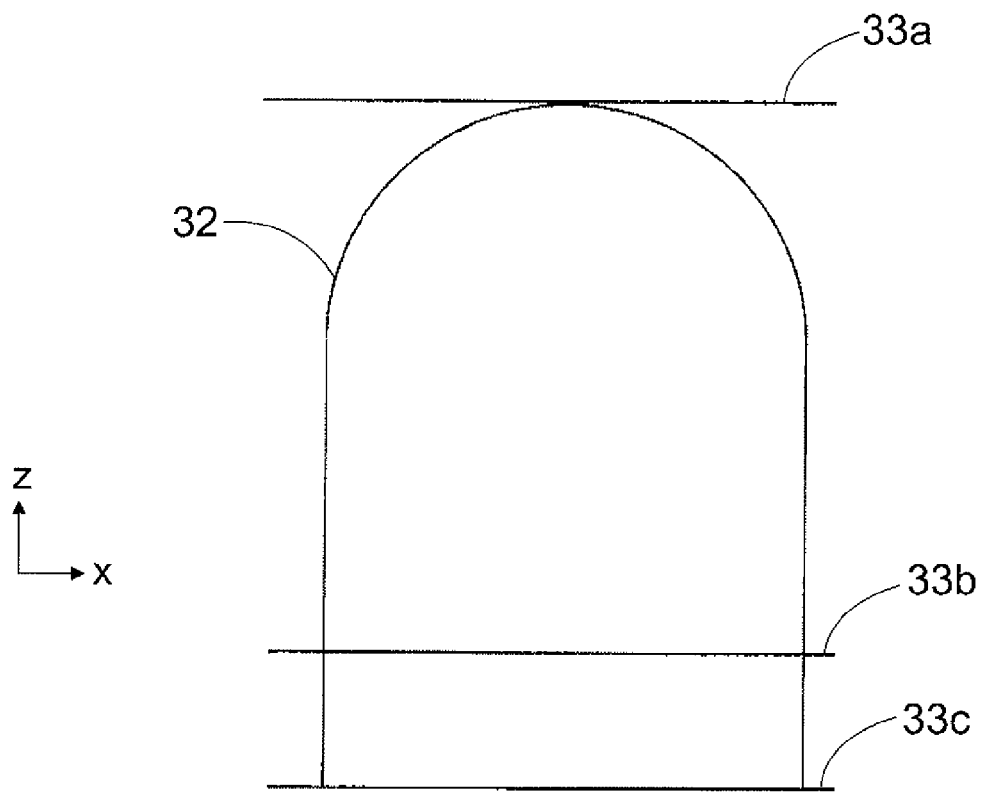
FIG. 6 is a schematic view in xz projection of a slicing tool to be presented on the display device of the design computer or the control unit.

FIG. 6 is a view of a display device of the design computer or a control unit in the rock drilling rig. The design program may comprise a slicing tool, wherewith the designer may slice the face profile 32 of the rock cavity in one or more slicing planes 33*a* to 33*c*. Thereafter the designer may observe the slicing planes 33 in desired projections.

Figure 7:
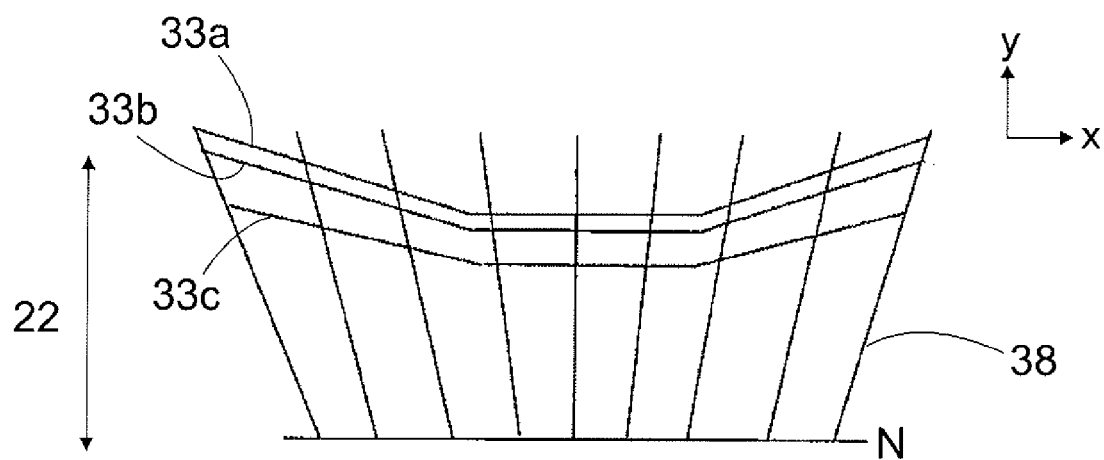
FIG. 7 is a schematic view in xy projection of various slicing projections of the slicing tool.

FIG. 7 shows the slicing planes 33*a* to 33*c* in the xy projection. The designer may manually determine the shape of the round bottom. The designer may determine a separate face profile for each slicing plane using straight lines and arches of a circle or the like shape lines, by which a desired shape in various slicing planes is cut for the round face. Thereafter, when the necessary interpolations are carried out for the portions between slicing planes, the data on the shape of the face are combined on the design computer, whereby a three-dimensional face profile is formed, which is fed into the design program for the drilling pattern design. In this case the designer thus draws up together with the design program a three-dimensional face profile.

Figure 8:
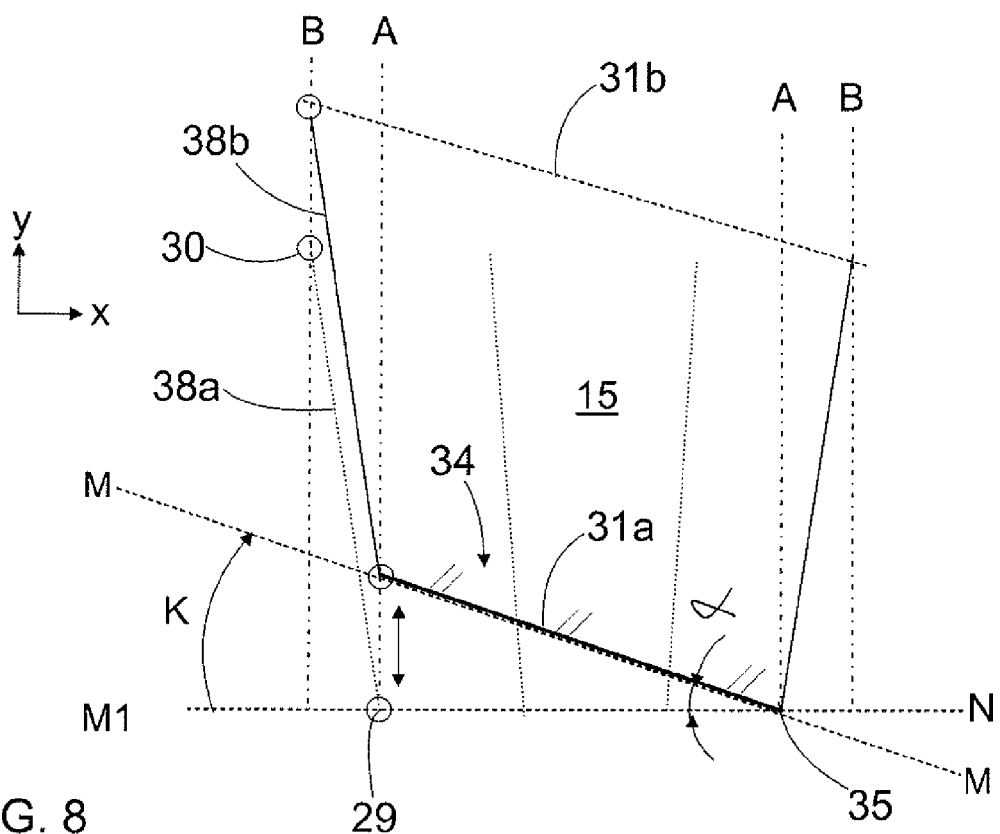
FIGS. 8 and 9 show schematically steps in designing the drilling pattern for a round having an inclined face bottom.
Figure 9:
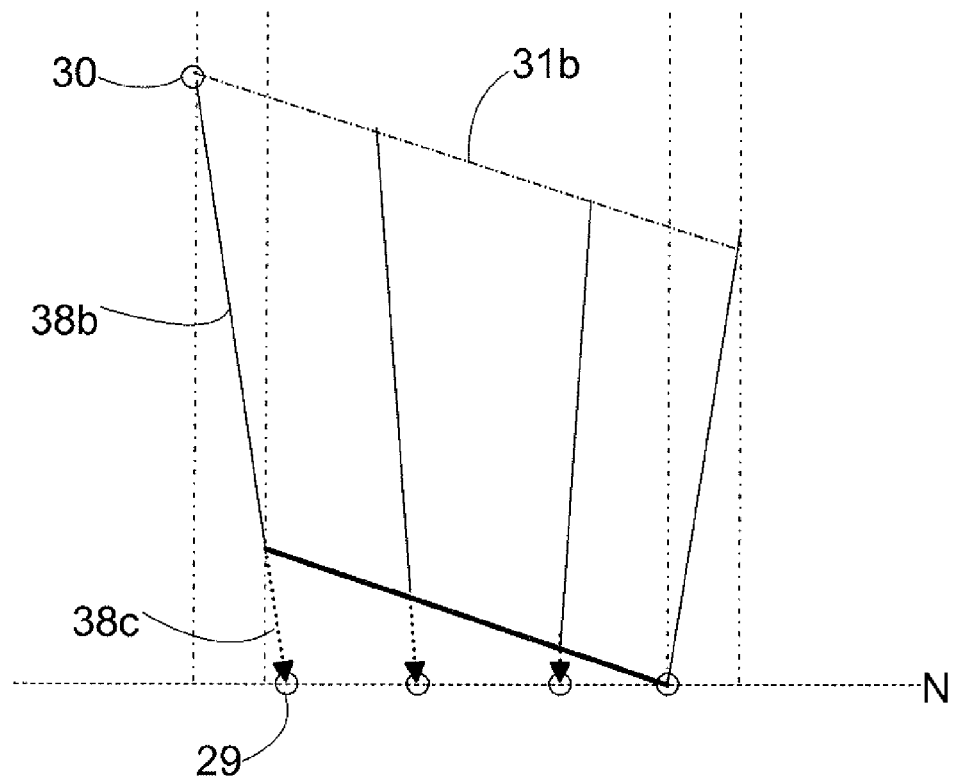

FIG. 8 shows a face 34 in a rock cavity, which is inclined in the xy direction, i.e. horizontally. In some cases a rock cavity is intentionally excavated such that the face is continuously inclined from one round to another. The use of an inclined face 34 may be well-founded, for instance, when in a pursuit of a larger rock cavity there is first excavated a pilot tunnel, which acts as an opening, in which the adjacent faces will be blasted. Consequently, in partial drilling patterns adjacent to the pilot tunnel there is not designed a specific cut. In FIGS. 8 and 9, on the left side of the face there appears such a pilot tunnel that extends in the y direction further than the face 34. Further in the text, in connection with FIG. 15, excavation based on a pilot tunnel will be discussed in greater detail.

The navigation plane N may be placed such that it runs through the outermost point 35 of the inclined face 34. Alternatively, it may be arranged to run through the innermost point of the face, for instance. The initial locations of the drill holes in accordance with the drilling pattern are placed in a conventional manner in the navigation plane N as the drilling pattern is designed. In FIG. 8 there are also marked allowed profile limits A and B of the excavation profile as well as an inclined face profile 31*a* of an already excavated round and a desired inclined face profile 31*b* of a new round, which face profiles 31*a* and 31*b* have a difference in direction with respect to the navigation plane N.

FIG. 8 shows how inclination of the face 34 may be modelled with an auxiliary plane M. First the auxiliary plane M may be arranged in the navigation plane N and drill holes of specific length starting from the navigation plane N may be transferred from the navigation plane N to the auxiliary plane M. Thereafter the auxiliary plane M may be rotated about the outermost point 35 of the face 34 in direction K such that between the navigation plane N and the auxiliary plane M there will be the same difference in direction as that between the navigation plane N and the face profile 31. The difference in direction may be fed to the design program as angular or distance data. The face profiles 31*a*, 31*b* may have the same difference in direction, i.e. the inclined face may continue having the same inclination or, alternatively, the inclination may be altered, whereby the face profiles 31*a*, 31*b* have varying differences in direction. The drill holes transferred to the auxiliary plane M shift in y direction during rotation. In FIG. 8, the original drill hole is denoted by reference numeral 38*a* and the transferred drill hole by reference numeral 38*b*. The drill holes 38 retain their original directions and lengths during rotation. Further, all other coordinates of the end points of the drill holes, except for y coordinates, remain the same. Thus, the end points of the drill holes fall in accordance with the original placement within the allowed profile limits A and B.

FIG. 9 shows that drill holes included in the drilling pattern may be further extended at their beginning in the direction of the drill hole up to the navigation plane N. In that case each drill hole will have a new length between the end point 30 and the starting point 29.

FIGS. 10 and 11 show an arrangement, which may be carried out in the control unit of the rock drilling rig and displayed on the display device prior to drilling or it may be simulated on the design computer after the drilling pattern design.

For designing, the rock cavity to be excavated is provided with a predetermined, theoretical outer contour and allowed profile limits A and B, and the end points of drill holes to be drilled in the end profile 17, i.e. end holes, should fall in the portion therebetween. If drilling of an end hole is started inside the inner profile limit A, underbreakage will occur at the starting point of the drill hole. Whereas, if the end point of the end hole is located outside the outer profile limit B, blasting detaches more rock than planned, i.e. overbreakage will occur. Under- and overbreakage are not desired, because in that case the rock cavity to be excavated will not meet the set dimensions and quality requirements.

FIG. 10 shows on the display of the rock drilling rig a situation where a feed device 5 is positioned outside the allowed profile limits A and B of the theoretical breaking profile of the rock cavity for drilling a hole on the end profile such that due to an erroneous starting point of drilling there is about to occur underbreakage in the contour of the rock cavity. This display may be presented automatically to the operator of the rock drilling rig and moreover the operator may be alerted in some other way of an imminent situation. Having received the alert, the operator may change the position of the feed device 5 manually so as to redress the situation. The position and direction of the feed device may be presented on a graphical display while being moved, and consequently it is easy for the operator to see the effect of the correction made. This is a useful feature, especially if, for one reason or another, the shape of the face in the rock cavity does not correspond to the shape modelled in the design program, as a result of which the designed drilling pattern is not applicable as such. In FIGS. 10 and 11 a continuous line depicts a drill hole 39a in making and a broken line 39c depicts a drill hole whose length is adjusted on the basis of the received alert. From the viewpoint of excavation, it would be most advantageous, however, to adjust the location of the drill hole 39a, on the basis of the received alert, to be in accordance with the drill hole 39b depicted by the broken line, whereby the advance of the rock cavity would be larger.

FIG. 11 is a schematic view in xy projection of a situation to be shown on the display of the rock drilling rig, where the feed device 5 is positioned for drilling a hole on the end profile to such a location that the hole 39a to be drilled would extend outside the allowed profile limits A and B of the theoretical excavation profile of the rock cavity, as a result of which overbreakage would occur in the profile of the rock cavity due to an erroneous starting point of drilling.

Thus, the method for alerting of under- or overbreakage may comprise at least the following operations of determining a theoretical excavation profile of a cavity to be excavated, an allowed minimum profile of the excavation profile and an allowed maximum profile of the excavation profile, and notifying the operator if a starting or end point of any one profile hole is located outside the area delimited by the allowed minimum profile and the allowed maximum profile.

Figures 12, 13:
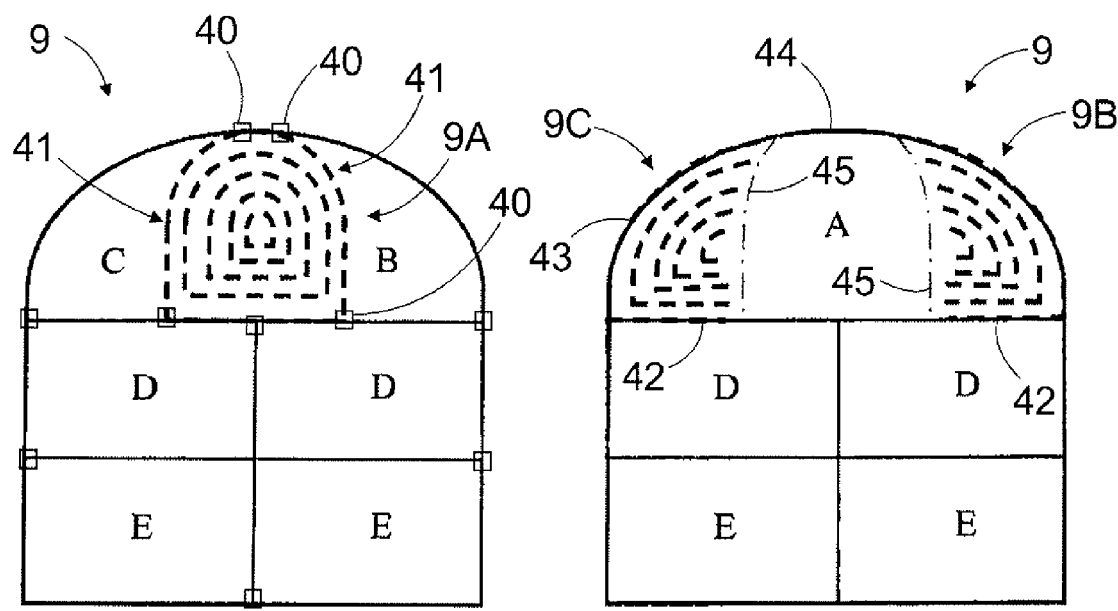
FIGS. 12 and 13 show schematically an option to divide a rock cavity having a large cross-sectional surface into parts, whereby a specific drilling pattern may be designed for each part.
Figure 14:
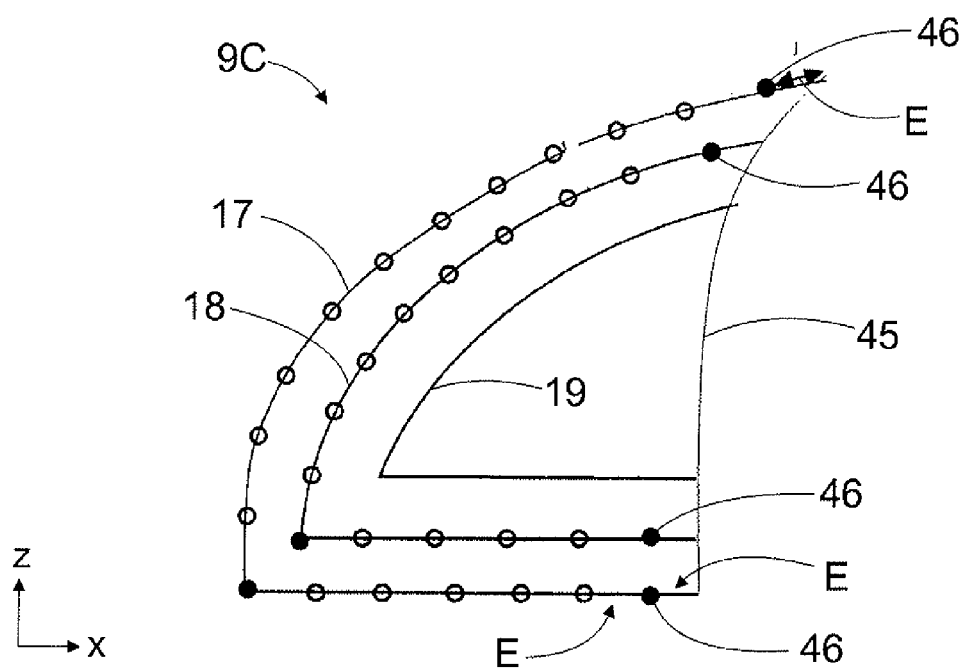
FIG. 14 shows schematically a partial drilling pattern, in which the side facing the already excavated cavity is defined by a so-called Free-line, the drill holes closest to said line locating with a defined hole spacing.

FIGS. 12 to 14 illustrate matter relating to division of a large pattern. When a drilling pattern is designed for a large rock cavity 23 to be excavated, it may be necessary to divide the large drilling pattern into two or more smaller partial drilling patterns. It may be necessary to divide the large pattern simply because of the extensive size thereof, or in some cases it may be necessary to perform the excavation in smaller parts because of poor rock quality or limitations to vibration. Typical rock cavities of large cross-section, in which division of the pattern into smaller partial drilling patterns may be an option, include underground car parks, storages, air raid shelters, large road and railway tunnels, etc. When a face of a large rock cavity is drilled, the rock drilling rig is typically positioned separately for each partial drilling pattern. In addition, each partial drilling pattern is blasted separately in a pre-designed order, whereby the space of the partial drilling pattern to be blasted first may serve as an opening for partial drilling patterns to be blasted subsequently. Thus, a cut and drill holes included therein need to be determined only for the partial drilling pattern to be blasted first. Alternatively, the partial drilling patterns may be blasted in one go. Further, the drilling pattern may be designed as if the drill holes of the entire large drilling pattern were drilled in one go. To conclude the design, the large drilling pattern may, however, be divided into partial drilling patterns.

For division of a large pattern it is possible to determine one or more dividing lines 40 that run through the dividing points 41 to be placed in the pattern. The locations of the dividing lines 40 may be determined already in connection with the drilling pattern design, but just as well it is possible to create dividing points 41 at a later stage in the completed drilling pattern. Further, the locations of the diving lines 40 are freely selectable and their locations may be edited at a later stage as the drilling pattern in general.

Various line types, such as Bottom 42, Wall 43, Roof 44 and Free 45, may be determined in the partial drilling patterns. FIGS. 13 and 14 illustrate the use of line types. The Free line 45 may be determined for a part of the partial drilling pattern that is facing a free space of an earlier excavated partial drilling pattern, and hence the term "Free". In this case the design program places the drill hole locations 46 closest to the wall defined by the line type Free at a designed hole distance E from the Free line 45, and not on said line as can be seen in FIG. 14. The use of the Free line 45 facilitates thus the placement of drill holes in the border area between excavated and unexcavated portions. Hence, it is possible to avoid unnecessary drilling of holes in the portion on the side of the already excavated space.

Figure 15:
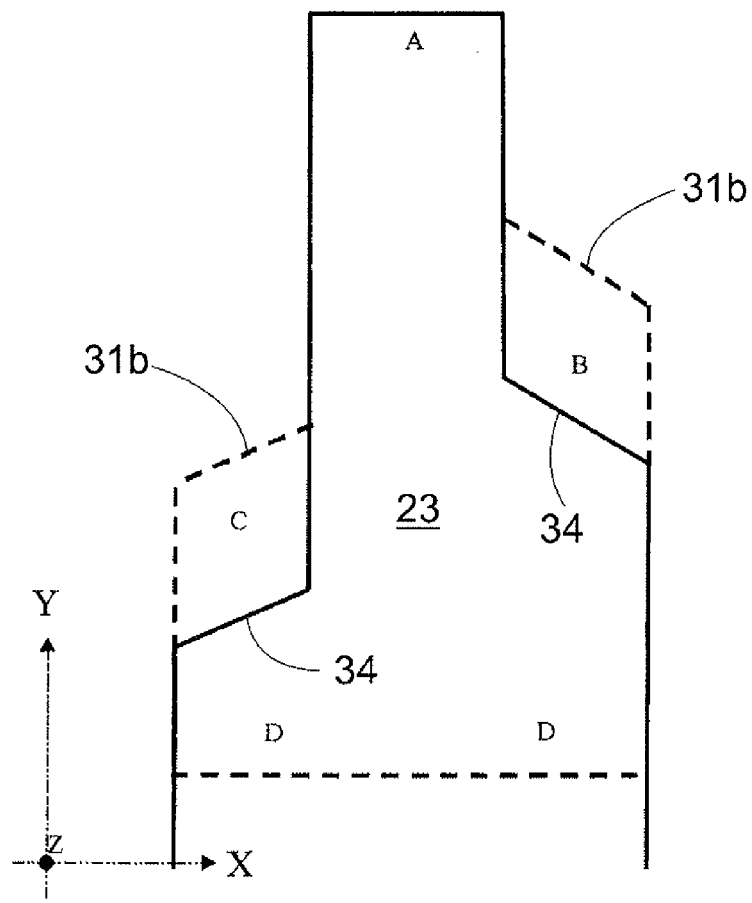
FIG. 15 shows schematically a drilling order for partial drilling patterns, seen from above, and further the use of a pilot tunnel and an inclined face in excavation.

FIG. 12 shows a partial drilling pattern designed for the topmost part A, i.e. for a kind of pilot tunnel. The drilling patterns may be designed separately for each partial drilling pattern. In FIG. 13 there are designed partial drilling patterns B and C, in which there are Free lines in portions on the side of the pilot tunnel to be blasted first, i.e. partial drilling pattern A. Excavation of parts D and E may also be carried out as so-called lifting excavation. In that case parts D are excavated prior to parts E. In the partial drilling patterns of parts D and E the uppermost surface is defined by a Free line. The excavation order of various parts A to E and the advancing may be selected case-specifically. FIG. 15 shows a top view of an excavation arrangement, in which the uppermost part, i.e. the so-called roof part A, advances first to be followed by parts B and C provided with inclined faces 34, and bottom parts D and E will be excavated clearly later.

A large drilling pattern to be divided should comprise at least one profile line that defines the cross section of the round to be drilled. Thereafter it is possible to place dividing points on the profile line and to divide the large cross sectional surface into smaller parts, for instance as shown in FIGS. 12 and 13. The dividing lines may be arranged vertically or horizontally as shown in FIGS. 12 and 13, but it is also possible to arrange dividing lines to be at a desired angle. Further, it is possible to form dividing lines which run through several dividing points and consist of several straight line parts or curved parts. After division it is possible to define the drilling order of the parts and the line types. Thereafter the partial drilling patterns may be designed as an independent whole for each part A to E.

Thus the method for dividing a large pattern may comprise at least the following operations of determining a profile line of a rock cavity having a large cross section; placing on the profile line at least two dividing points through which a dividing line is arranged to run; dividing the original larger cross section of the rock cavity into at least two smaller parts by means of the dividing line; defining the excavation order of the parts; and defining independent drilling patterns for each part. Further, an embodiment of this method may comprise the following features: the first partial drilling pattern concerns a pilot tunnel round, which is excavated first, and the second partial drilling pattern concerns a round adjacent to the pilot tunnel, which is opened into the pilot tunnel in blasting. Further, a second embodiment of this method may comprise the following features of determining in the second partial drilling pattern locations of the end points of the drill holes such that there will be a horizontal difference in directions between the plane running therethrough and the navigation plane; and excavating the tunnel adjacent to the pilot tunnel such that the difference in directions between the face to be formed and the navigation plane remains the same from one round to another. Further, a third embodiment of this method may comprise the following features of determining in the second partial drilling pattern at least one Free line, which is facing the pilot tunnel; and placing automatically, by the drilling pattern design program, the drill holes closest to the Free line at a given distance from the Free line. Further still, an optional method may comprise the following features of designing first one drilling pattern for a rock cavity of large cross section; editing the drilling pattern by determining at least two dividing points at desired locations in the original drilling pattern; forming a dividing line that runs through the dividing points and divides the original drilling pattern into at least two independent partial drilling patterns; and updating adjacent partial drilling patterns at least at the dividing area so as to avoid extra drill holes.

Figure 16:
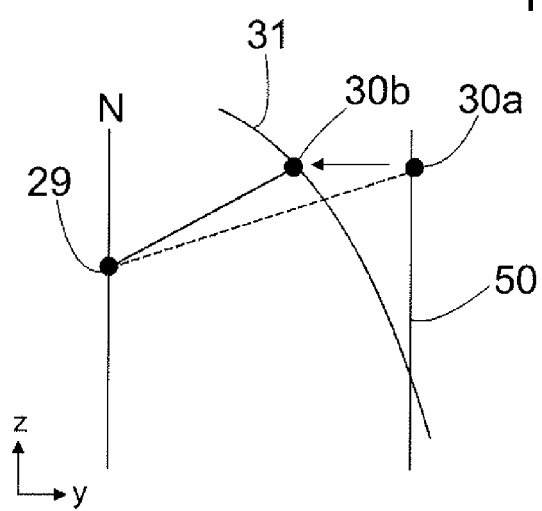
FIGS. 16 and 17 show schematically yet some options for positioning the end points of drill holes on the provided face profile.
Figure 17:
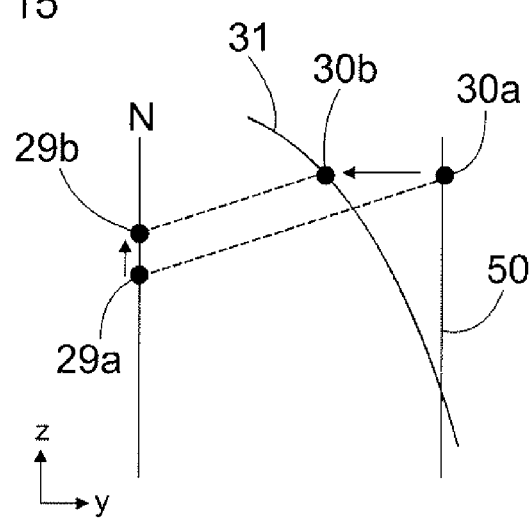

FIGS. 16 and 17 show yet some embodiments whose basic idea is to place the end points 30a of the drill holes first in plane 50 on the bottom of the round. Thereafter the drilling pattern is modified by transferring the original end points 30a of the drill holes to a face profile 31 fed to the design program. In the solution of FIG. 16, during the transfer the coordinates of the end points and the starting point in the direction of the navigation plane N are retained, i.e. the x and z coordinates of the original end points 30a and the transferred end points 30b remain the same. Whereas the y coordinates of the end points change. Likewise, the directional angles of the drill holes change. In FIG. 17, in turn, the transfer of the end points from plane 50 to the face profile 31 is carried out by retaining the original directions of the drill holes and the coordinates of the end points in the direction of the navigation plane N. In other words, the original end points 30a and the transferred end points 30b have the same x and z coordinates. Whereas the y coordinates of the end points change. Likewise, the starting points of the drill holes in the navigation plane N changes from location 29a to location 29b. The solutions shown in FIGS. 16 and 17 are alternatives to the arrangement shown in FIG. 4, in which the end points of the drill holes are transferred to the face profile such that the original direction of the drill holes remains and the coordinates change.

In some cases the features disclosed in this application may be used as such, irrespective of other features. On the other hand, when necessary, the features disclosed in this application may be combined to provide various combinations.

The drawings and the relating specification are only intended to illustrate the inventive idea. The details of the invention may vary within the scope of the claims.

The invention claimed is:

1. A method for designing a drilling pattern for rock cavity excavation, in which the drilling pattern determines for a round to be drilled in a face of the rock cavity at least the locations and directional angles of drill holes in a coordinate system of the drilling pattern and the lengths of the drill holes, and which method comprises:
    creating the drilling pattern with the assistance of a computer using a design program,
    determining a navigation plane of the drilling pattern,
    determining starting points of holes to be drilled in the navigation plane,
    determining first end points of the holes to be drilled, the first end points of all holes in the drilling pattern being in a common plane with a planar portion of a bottom of the round,
    feeding to the design program a desired face profile representing the shape of the face in the round to be drilled, the desired face profile including a planar portion and a non-planar portion, and
    modifying the drilling pattern by transferring at least some of the first end points of the holes to second end points located on the non-planar portion of the desired face profile, and
    wherein the second end points are spaced from the common plane containing the non-transferred first end points, and
    wherein drill holes of different lengths in the modified drilling pattern produce the shape of the desired face profile.

2. The method of claim 1, comprising:
    feeding into the design program a predetermined, three-dimensional profile model of the rock cavity to be drilled,
    defining for the design program a location of the round in said profile model,
    defining by means of the location of the round to be drilled and said three-dimensional profile model a desired face profile of the bottom of the round to be drilled, and
    placing the second end points of drill holes on said desired face profile while maintaining an original direction of each of the drill holes.

3. The method of claim 1,
    wherein the first end points are transferred while maintaining the coordinates of the starting points and end points of the drill holes in a direction of the navigation plane whereby y coordinates of end points change and the x and z coordinates remain unchanged.

4. The method of claim 1,
    wherein an original direction of each of the drill holes is maintained.

5. The method of claim 1, comprising:
    feeding into the design program a predetermined, three-dimensional profile model of the rock cavity to be drilled, and
    determining a location of the round in the profile model by means of peg numbers that are determined as distances from a predetermined reference point.

6. The method of claim 1, comprising designing a drilling pattern for a rock cavity including a sharp curve, whereby the desired face profile of the round comprises, when observed in the direction of the round, a portion of a curved side profile and a substantially planar portion on the bottom of the round.

7. The method of claim 1, comprising designing a drilling pattern for a rock cavity including a curved roof contour, whereby the desired face profile of the round comprises, when observed in the direction of the round, a portion of the curved roof contour and a substantially planar portion on the bottom of the round.

8. The method of claim 1, comprising determining manually on the design computer the shape of the bottom in the round and feeding the desired face profile into the design program for the drilling pattern to be designed.

9. The method of claim 1 comprising:
    determining manually on the design computer the shape of the bottom in the round and feeding the desired face profile into the design program for the drilling pattern to be designed, dividing the bottom of the round into at least two slicing planes, defining a desired face profile separately for each slicing plane by using shape lines wherewith a desired shape is cut for the round in slicing plane, and combining data on the slicing planes in the design program, whereby a three-dimensional desired face profile is obtained.

10. The method of claim 1, wherein different lengths of the drill holes in the drilling pattern are used to transfer the first end points to the second end points, and wherein the second end points define the non-planar shape of the desired face profile.

11. A non-transitory storage device including a software product whose execution on a design computer provides the following operations:

designing a drilling pattern in an interactive manner, placing in the drilling pattern a plurality of drill holes and starting points thereof in a navigation plane, and placing first end points of the drill holes at first locations in a common plane with a planar portion of a bottom of a round in the drilling pattern, wherein execution of the design program moves at least some of the first locations to second locations in response to feeding to the design computer a desired face profile representing a shape of the face in the round to be drilled, whereby drill holes of different lengths in the drilling pattern define the shape in accordance with the desired face profile and the at least some of the first end points are transferred to second end points, the second end points located on a non-planar portion of the desired face profile and spaced from the common plane containing the non-transferred first end points.

* * * * *